United States Patent [15] 3,674,656
Yates [45] July 4, 1972

[54] BONDING TREATMENT AND PRODUCTS PRODUCED THEREBY

[72] Inventor: Charles B. Yates, Willingboro, N.J.

[73] Assignee: Circuit Foil Corporation, Bordentown, N.J.

[22] Filed: June 19, 1969

[21] Appl. No.: 839,777

[52] U.S. Cl. ....................204/13, 204/15, 204/28, 204/208, 204/216, 204/231

[51] Int. Cl. ....................C23b 7/02, C23b 5/48, C23b 5/58

[58] Field of Search ....................204/231, 24, 277, 38 E, 208, 204/13, 15, 28

[56] References Cited

UNITED STATES PATENTS

| | | | |
|---|---|---|---|
| 1,473,060 | 11/1923 | Taylor | 204/277 |
| 1,806,587 | 5/1931 | Cowper-Coles | 204/208 |
| 1,952,762 | 3/1934 | Levy et al. | 204/216 |
| 3,220,897 | 11/1965 | Conley et al. | 148/34 |
| 3,227,637 | 1/1966 | De Hart | 204/224 |
| 3,293,109 | 12/1966 | Luce et al. | 161/166 |
| 3,328,275 | 6/1967 | Waterbury | 204/38 |

FOREIGN PATENTS OR APPLICATIONS

| | | |
|---|---|---|
| 26,281 | 1896 | Great Britain |
| 37/18870 | 5/1961 | Japan |

*Primary Examiner*—John H. Mack
*Assistant Examiner*—T. Tufariello
*Attorney*—Lane, Aitken, Dunner & Ziems

[57] ABSTRACT

A method of producing metal foil having enhanced bond strength comprising forming said metal foil in a body of electrolyte at a first cathode current density and forming a non-powdery series of spaced projections on said foil by making the latter while subjecting it in said body of electrolyte to a cathode current density significantly in excess of the former current density. Apparatus for producing metal foil having the characteristics described. Metal foil having the characteristics described. A laminate including a substrate bonded to said metal foil and having the characteristics described.

18 Claims, 3 Drawing Figures

INVENTOR
CHARLES B. YATES

BY Lane, Aitken, Dunner & Ziems
ATTORNEYS

INVENTOR

CHARLES B. YATES

BY Lane, Aitken, Dunner + Ziems
ATTORNEYS

BONDING TREATMENT AND PRODUCTS PRODUCED THEREBY

BACKGROUND OF THE INVENTION

It is known in the art to improve the bond strength of metal foil by forming a matte surface on at least one side of said foil. Merely by way of example, Waterbury U.S. Pat. No. 3,328,275 discloses an electrochemical treatment to form a dendritic copper electrodeposit on one surface of the foil which improves the bonding characteristics of the foil with respect to an appropriate substrate. The resulting product is said to be particularly adapted for use in making printed electronic circuits.

Similarly, Conley et al. U.S. Pat. No. 3,220,897 describes a method of forming a nodularized, dendritic copper electrodeposit on the surface of copper foil which, similarly, is said to improve the bonding characteristics of the foil to make it particularly useful for the manufacture of printed electronic circuits.

Electrochemical treatments such as the foregoing primarily rely upon the use of electrolytes impoverished in their copper concentration immediately adjacent the deposition surface so as to promote cathodic polarization at such surface. The result of this approach is that one obtains a dendritic deposit in which preferential deposition of copper takes place at the outer extremities of the dendrites since the latter are in contact with electrolyte much richer in copper ion content than that in contact with the trunk portions of the dendrites immediately adjacent the base foil.

While techniques such as the foregoing serve to increase the bond strength of metal foil to 9–11 pounds per inch of width (using an accepted printed circuit pull test as the basis for measurement), or occasionally higher bond strengths, they suffer from one or more of a number of deficiencies. More specifically, in treatments such as the foregoing, one frequently encounters a phenomenon which approaches what is known in the industry as "rotten copper" in which one obtains a copper formation or growth which is not firmly anchored to the base foil. In fact, the removal of this copper is often effected without any difficulty, creating significant problems when the treated foil is bonded to a plastic support for potential printed circuit applications. By way of example, in specialized applications involving high fluidity resins (such as are used in multi-layer circuitry), the resin in its fluid state moving past the face of the foil during the high temperature pressing operation tends to shear off the nodular deposit. These microscopic nodules of copper then remain embedded in the laminate so that after the copper is etched off the laminate during the circuit making step, the laminate displays vague shadows and discolorations which are often significantly pronounced.

BRIEF SUMMARY OF THE INVENTION

In accordance with the present invention, a novel technique has been discovered which eliminates problems such as those described above and which, during the primary foil-making operation, forms an electrodeposit on the surface of the base metal in the form of substantially non-powdery, spaced projections having substantially the same mechanical properties as the foil from which they project. The resulting foil exhibits bond strengths significantly in excess of those exhibited by prior art untreated foil and equal to or in excess of those exhibited by prior art treated foils. This is accomplished in accordance with the present invention by forming said metal foil in a body of electrolyte at a first cathode current density and forming a non-powdery series of spaced projections on said foil by making the latter while subjecting it in said body of electrolyte to a cathode current density significantly in excess of the former current density.

It is accordingly a primary object of the present invention to provide a novel process, apparatus and products resulting therefrom for significantly improving the bond strength of metal foil.

It is another important object of the present invention to provide an apparatus for improving the bond strength of metal foil by forming said metal foil in a body of electrolyte at a first cathode current density and forming a non-powdery series of spaced projections on said foil by making the latter while subjecting it in said body of electrolyte to a cathode current density significantly in excess of the former current density.

Other important objects and advantages of the present invention will become more apparent as the ensuing description proceeds.

DETAILED DESCRIPTION OF THE INVENTION

As will be pointed out hereafter in greater detail, the improved treating process of the present invention is adapted to the improvement in bond strength of a great variety of metals through the electrodeposition on their surfaces not only of a deposit of the same metal but of other metals, as well. Because one of the prime areas of use of the process of the present invention is in the improvement of bond strength of copper foil for printed circuit applications through the addition to a surface of such foil of electrodeposited copper, however, the immediately ensuing description will be couched in terms of such copper foil which is the preferred embodiment of the present invention. It is to be understood, however, that the present invention is equally applicable to the improved treatment of other metals, as well.

In the manufacture of copper foil for printed circuit applications, a preferred technique involves the use of a drum cathode which rotates partially immersed in a body of copper sulfate electrolyte adjacent a pair of curved anodes. As the drum rotates in the electrolyte, an electrodeposit of copper forms on the drum cathode surface and, as the latter leaves the electrolyte, the electrodeposited copper is stripped from the surface of the rotating drum in the form of a thin foil, slit to size and wrapped around a take-up roll.

Such a system employing soluble anodes is disclosed in Conley et al. U.S. Pat. No. 3,151,048. An analogous system employing insoluble anodes is disclosed in Zoldas U.S. Pat. No. 2,865,830. While forming no part of the present invention except as pointed out in greater detail hereafter, the novel process of the present invention is preferably carried out in apparatus of the Zoldas type employing insoluble anodes though preferably employing a drum cathode having a stainless steel surface. Such a system is disclosed in FIG. 1.

Figure 1:
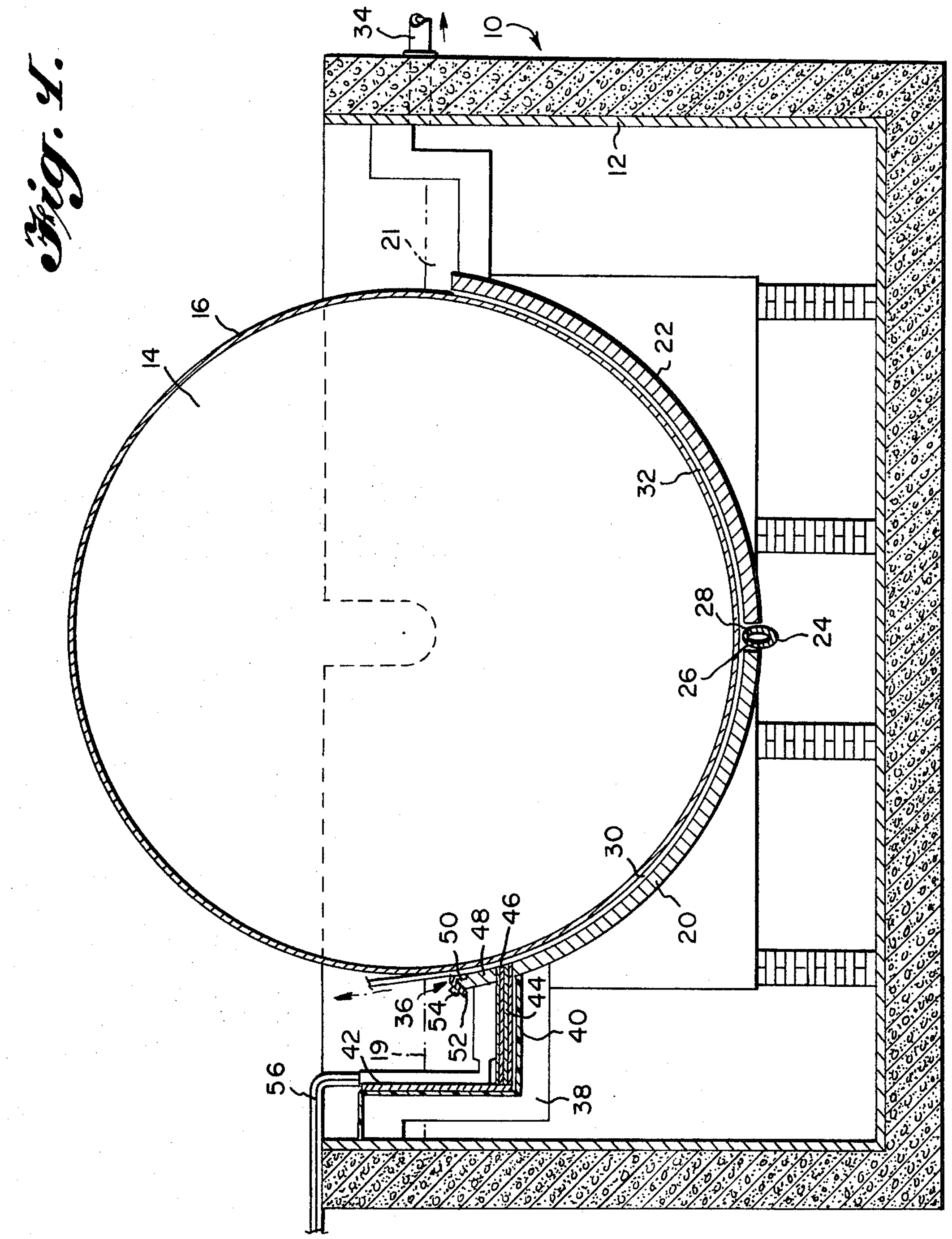
FIG. 1 is a front elevation, partly in section of a preferred embodiment of apparatus for producing metal foil in accordance with the present invention.

The apparatus of FIG. 1 comprises a tank 10 formed of appropriate non-conducting material (such as concrete) the interior wall 12 of which is lined with lead. In the center of tank 10 a drum cathode indicated generally at 14 and having a stainless steel outer surface 16 is mounted for rotation by conventional mounting means (not shown). Drum 14, which has an axial dimension of about 48 inches and an outer circumference of about 22 feet, is maintained in electrical contact with the negative terminal (not shown) of an appropriate power source.

Drum 14 is mounted so that approximately its lower half extends into tank 10 to be positioned beneath the surface 19 of the electrolyte 20. As shown in FIG. 1, positioned adjacent drum 14 are a pair of curved insoluble anodes 20 and 22 which are mounted in close proximity to the two lower quadrants of the cylindrical face of drum 14. Anodes 20 and 22 may appropriately be fabricated of a lead-antimony alloy (containing approximately 6 percent by weight antimony)

and, for the drum size previously noted, having a two inch thickness, an axial dimension (parallel to the axis of drum 14) of approximately 50 inches and an exposed inner face dimension (measured in a circumferential direction as shown in FIG. 1) of approximately 48 inches. Appropriate spacing between anodes 20 and 22 and the drum 14 is approximately three-eighths to 1 inch.

Positioned between the lowermost facing (but separated) ends of curved anodes 20 and 22 (approximately 1 inch from each) is an electrolyte inlet manifold 24 which extends axially adjacent the lowermost edge of drum 14 throughout the full length of the latter in the same manner in which manifold 36 is arranged in Zoldas U.S. Pat. No. 2,865,830. Manifold 24 is provided with two axially extending rows 26 and 28 of ports (similar to discharge ports 48 in the Zoldas structure) which are adapted to distribute electrolyte into the electrolyte spaces 30 and 32 adjacent to anodes 20 and 22, respectively. Manifold 24, the cross-sectional dimensions of which are approximately 1½ by 4½ inches, is connected to an appropriate source of electrolyte (not shown).

Tank 10 is also provided with an electrolyte outlet 34 (which may appropriately be provided in the form of a weir, not shown). As will be apparent to those skilled in the art, the overflow from outlet 34 may be connected to electrolyte manifold 24 for convenient recirculation of the electrolyte in tank 10.

Thus far, the apparatus described forms no part of the present invention and is utilized in the manner previously indicated to form electrodeposited copper foil which, as illustrated in FIG. 1, is stripped off drum 14 at 36 in an appropriate manner not relevant to the present invention. This foil is then slit to size, rolled onto a take-up reel and, at least where it is destined for printed circuit applications, ordinarily subjected to a treatment to improve its bond strength such as is disclosed in Conley et al. U.S. Pat. No. 3,220,897 or Waterbury U.S. Pat. No. 3,328,275.

High quality copper foil well adapted for use in printed circuit applications may be made using a system such as has been described above under the following approximate conditions:

TABLE A

| Process Condition | Acceptable Parameters | Preferred Condition |
|---|---|---|
| Cathode current density (amps/ft$^2$) | 200–900 | 900 |
| Electrolyte temperature (°F.) | 70–170 | 150 |
| Copper concentration (grams Cu/liter) | 35–120 | 90 |
| Acid concentration (grams $H_2SO_4$/liter) | 75–120 | 100 |
| Electrolyte circulation (liters/min.) | 50–200 | 90 |
| Voltage (between anode and cathode) | 2.8–5 | 5 |
| Electrodeposition time (expressed in terms of linear inches of copper removed from the rotating drum per min. for one oz. foil) | 10–40 | 40 |

Untreated foil produced as described above has a bond strength (expressed in pounds per inch of width of foil) of about 1–4; when such foil is treated by a technique such as described in Conley et al. U.S. Pat. No. 3,220,897, bond strengths in the neighborhood of 9–11 are alleged not to be uncommon. In accordance with the present invention to be described in detail hereafter, copper foil can be produced directly from the foil-making tank, without the necessity for any further treatment, having bond strengths of 13–15 and, when subsequently treated as is copper foil presently produced, bond strengths as high as 20 can be readily attained. This enormous increase in bond strength is attained by means of the mechanism shown in FIG. 1 and in greater detail in FIG. 2.

Figure 2:
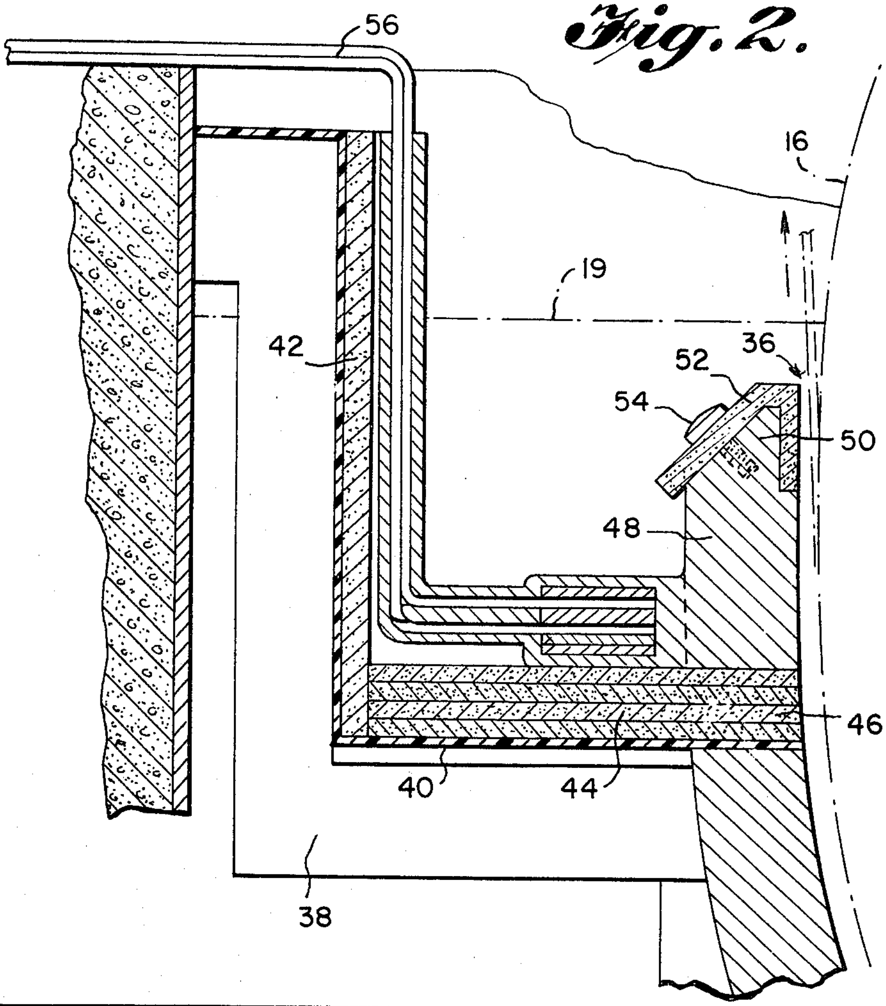
FIG. 2 is an enlarged detail drawing, partly in section, of a portion of the apparatus of FIG. 1.

As shown therein, anode 20 is provided at its uppermost end with an L-shaped anode chair 38 which is appropriately formed of lead. Positioned along the inner face of the base and leg of anode chair 38 is an insulating membrane 40 which may be formed of Mylar, polyethylene or the like and which is used to avoid current leakage. Positioned on the inner face of the insulating membrane 40 are additional insulating layers 42 and 44 which may appropriately be made of Mycarta. As shown in FIG. 2, the Mycarta layer 44 positioned atop the base of anode chair 38 is considerably thicker than Mycarta layer 42. Positioned atop the end portion 46 of Mycarta layer 44 is a secondary anode 48 which may appropriately be made of the same material of which the primary anode 20 is constructed. Secondary anode 48 is provided with a wedge shape terminal portion 50 which is in turn covered with an inverted V-shaped Mycarta insulating covering 52 which is attached thereto by a bolt 54 or the like. As shown in FIG. 2, secondary anode 48 is connected by means of conductors 56 to the positive terminal of a separate power source distinct from the power source to which primary anodes 20 and 22 are connected. As will be readily seen both in FIG. 1 and, in greater detail, in FIG. 2, primary anode 20 and secondary anode 48 present, together with the Mycarta insulation 44 separating them, a continuous, smooth anode face all portions of which are substantially equi-distant from the face of rotating drum cathode 14.

In accordance with the present invention, the uniquely improved bond strength of the initially produced metal foil is achieved by selecting the respective power sources to which secondary anode 48 and primary anode 20 are connected such that the cathode current density opposite the former is sufficiently in excess of that opposite the latter so that metal electrodeposited on the drum cathode adjacent the secondary anode forms at a plurality of spaced locations rather than substantially uniformly across the base metal foil.

By subjecting the metal foil being formed in the primary electrodeposition tank to a sufficiently high current density through a portion of the electrodeposition cycle as aforenoted, a wholly unique effect on the surface of the metal foil is produced, distinctly different from the surface produced by conventional treatments. As previously noted, the conventional eleectrochemical treatment techniques rely heavily upon the use of impoverished copper electrolyte in order to form a dendritic or similar surface structure which is sufficiently roughened to improve the bonding of the resulting foil to form laminates. As was also noted, the surfaces resulting from such treatments are often powdery in nature, such powder being only lightly anchored to the base metal and being often readily removed during the laminating process. The surfaces resulting from the present invention, on the other hand, are highly roughened surfaces in the form of ductile copper which is not powdery and which has few if any of the disadvantages of foils resulting from prior art treatments. Stated differently, the copper surface resulting from conventional prior art treatments is in the form of a plurality of individual, powdery micronodules which are extremely small, generally smaller than the power of resolution of an optical microscope. The surface of the copper produced in accordance with the present invention, on the other hand, is in the form of non-powdery,tree-like growths each portion of which is generally larger than the counterpart micronodule of the prior art treatments.

Significantly, the spaced projections of the tree-like growths formed in accordance with the present invention have essentially the same mechanical properties (viz., ductility, tensile strength, denseness and the like) of the base metal or foil from which they project, a fact distinctly absent from the prior art treated foil. The reason for this is clear in light of the present invention: the foil formation during operation of the present invention takes place completely in a single body of electrolyte having a uniformly high copper concentration comparable to the concentration employed to make the base metal. Because of this fact, all of the foil formed, both that of the base metal and that of the electrodeposit formed by means of the secondary anode, is composed of the same high quality metal which would be obtained from the basic foil-making operation. Prior art treatments, on the other hand, involve plating from an electrolyte which is depleted in copper concentration (ordinarily at the very lower limit of concentration at a given current density) so as to make plating extremely difficult.

The size of the nodules resulting from conventional treatments is about $1/10 \times 10^{-6}$ to $1 \times 10^{-6}$ inches in average diameter; that of the basic matte structure of untreated copper foil is approximately $200–500 \times 10^{-6}$ inches in diameter; the major portion of the tree-like growths resulting from the practice of the present invention, on the other hand, have average diameters of about $8–80 \times 10^{-6}$ inches.

Figure 3:
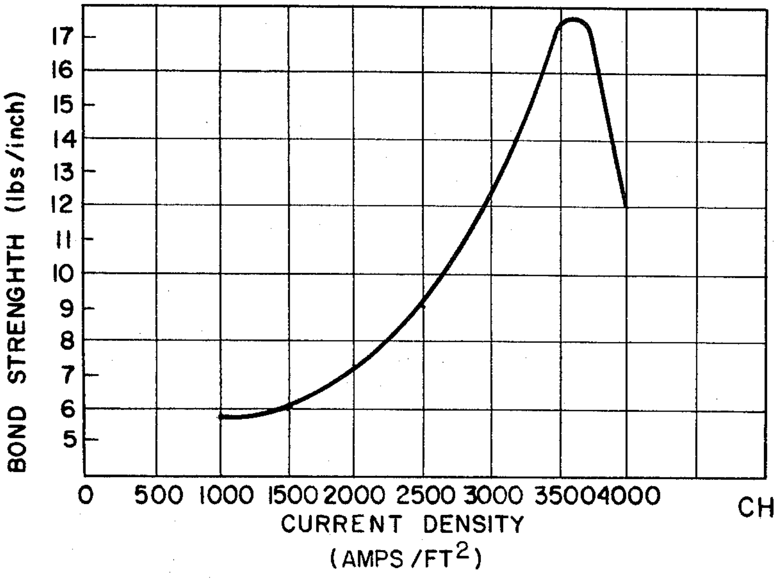
FIG. 3 is a graph plotting bond strength of copper foil against cathode current density employed during the foil-making operation.

The improvement in bond strength imparted to copper foil formed by the process of the present invention is readily illustrated in FIG. 3, which plots bond strength of the foil (in pounds per inch of copper foil) against cathode current density adjacent the secondary anode.

The bond strength figures used to plot the graph illustrated in FIG. 3 were determined by bonding the copper foil (with the surface of the foil which had been exposed to the secondary anode in contact with the substrate) to an epoxy resin-impregnated fiberglass support in a conventional manner. The epoxy resin was used in its "B" stage and was cured in contact with the foil under a pressure of about 500 psi at about 330°–340° F. The final thickness of the laminate was approximately one-sixteenth of an inch with the foil comprising about 0.015 inches of this total.

The laminate so constructed was then cut into ½ inch wide strips and peeled from the fiberglass cloth support at a rate of 2 inches per minute in a direction perpendicular to the laminate. The force required to peel the copper from the support was read on a force gauge and was measured in pounds of force. This reading was doubled to obtain the peel strength per inch of laminate, which are the figures measured along the ordinate of the graph of FIG. 3.

The figures plotted in the graph of FIG. 3 were obtained on copper foil produced under the conditions in Table B, with variations being made solely in the cathode current density adjacent the secondary anode at 1,000, 1,500, 2,000, 2,500, 3,000, 3,500, 3,725 and 4,000 amps/ft². The equipment employed included a stainless steel drum (as described above), Pb-Sb insoluble anodes (6 percent by weight Sb) and an aqueous $H_2SO_4$ electrolyte.

TABLE B

| Process Condition | Condition Employed |
|---|---|
| Cathode current density (amps/ft²) | 1000–4000 |
| Temperature (°F.) | 163 |
| Copper concentration (grams of Cu/liter) | 94 |
| Acid concentration (grams $H_2SO_4$/liter) | 103 |
| Electrolyte circulation (liters/min.) | 84 |
| Voltage (between main anode and cathode) | 4.8 |
| Voltage (between main anode and cathode) | 6.2–18.6 |
| Electrodeposition time (expressed in terms of linear inches of copper removed from the rotating drum per min. for one oz. foil) | 38–42 42 |

As will be noted from FIG. 3, the significantly improved results in bond strength first began to be exhibited at about 1,500 amps/ft², rising sharply thereafter and reaching a peak at between 3,500 amps/ft² and 3,725 amps/ft². The bond strength achieved at 2,500 amps/ft² (9 lbs. per inch of width of foil) is today considered by some to be the minimum acceptable bond strength for printed circuit applications and 2,500 amps/ft² is, accordingly, the preferred cathode current density adjacent the secondary anode, at a Cu concentration of 90 gms/liter.

It is believed that the unique results of the present invention are obtained as a result of the combination of the employment of a high cathode current density opposite the secondary anode with the creation of a foam froth as a result of oxygen formation at the anode-electrolyte interface of anode 20. More specifically, insoluble anode 20 causes the formation in the electrolyte space 30 between it and the adjacent surface of drum cathode 14 of a froth formed of a quantity of extremely small oxygen bubbles constituting approximately one-quarter to one-half the volume of the electrolyte in such space and which serve to agitate the electrolyte in space 30 significantly. More importantly, these small oxygen bubbles tend to isolate portions of the copper electrodeposit on the adjacent drum surface from the highly concentrated electrolyte which otherwise would contact it. As a result, such bubbles effectively serve to screen or mask spaced portions of the base foil from such electrolyte. Such masked, spaced foil portions accordingly tend not to receive any further electrodeposit. The result is that the foil portions between such masked portions continue to receive an electrodeposit which grows into the tree-like, spaced projections previously described. As noted, these tree-like projections are formed from the same concentrated electrolyte as the base metal, are firmly anchored to the latter and possess substantially the same mechanical properties.

In order to achieve most effective results in the practice of the present invention, it is desirable to insulate secondary anode 48 sufficiently well from the primary anode 20 so as to minimize the loss of current from the former to the latter. Toward this end, the thickness of the Mycarta insulation layer 46 should be maintained at a minimum thickness necessary to accomplish this result.

In the preferred embodiment of the present invention, utilizing an electrolytic cell having dimensions of the nature previously indicated and maintaining a cathode current density opposite the primary anode 20 and adjacent the secondary anode 48 of approximately 900 and 2,500 amps/ft², respectively, the thickness of the Mycarta insulation layer 46 should be approximately 2 inches. As the thickness of this layer is reduced significantly below 2 inches under the conditions indicated, the stray current passing from the secondary anode 48 to the primary anode 20 will be sufficiently high that the cathode current density opposite the secondary anode portion 48 may be reduced below the level desirable for most efficient results. On the other hand, thicknesses significantly greater than 2 inches under the conditions indicated may very well result in a loss of efficiency of the system.

The particular thickness of insulation layer 46 to be used under a given set of conditions will be dependent upon a number of variables. For example, the lower the potential difference between the secondary anode 48 and primary anode 20, the lower will be the current loss from the former to the latter and the thickness of the insulation layer 46 required to minimize current loss. Similarly, the lower the concentration of the desired metal ions in the electrolyte, the lower the cathode current density required to achieve the ultimately desired surface treatment; the greater such concentration, the greater the current density required. Thus, as previously indicated, using a copper sulfate electrolyte, highly desirable results are obtained utilizing a copper ion concentration in the electrolyte of 90 grams/liter and a cathode current density opposite the secondary anode 48 of about 2,500 amps/ft²; utilizing a copper ion concentration in the electrolyte of about 60 grams/liter, on the other hand, a cathode current density opposite secondary anode 48 of about 1,500 amps/ft² would produce desirable results.

While the particular insulation thickness of Mycarta layer 46 will vary depending upon the choice of process parameters as aforenoted, those skilled in the art will recognize that the optimum thickness may be readily determined in light of the foregoing teachings.

The relative dimensions of secondary anode 48 compared with the primary anode 20 will, of course, determine the portion of the total treatment time during which the foil which has been electrodeposited on the rotating drum 14 will be subjected to the novel treatment of the present invention. While there is no precise portion of the total treatment time which must be represented by the secondary anode's influence on the final product, the preferred portion of the total is obviously somewhere between 0 and 100 percent. Stated differently, as the size of secondary anode 28 is reduced towards 0, its effectiveness in influencing the character of the metal foil surface is similarly reduced; at the opposite extreme, the increase in the proportion of the total anode surface constituted by the secondary anode 48 towards 100 percent is equally undesirable since the end result would be the production of rotten copper.

Generally speaking, best results are obtained when the size of the secondary anode portion relative to the primary anode portion is selected such that that portion of the total weight of the metal foil added by the former is approximately 6–8 percent. Thus, if the end goal is to make 1 ounce copper foil (1 ounce of copper per square foot of foil), the speed of the rotating drum cathode and the relative dimensions of the main and secondary anodes would be selected such that the amount of foil produced opposite the main anode portion will be approximately 0.92–0.94 ounces of copper per square foot with that produced opposite the secondary anode portion being approximately 0.06–0.08 ounces per square foot. This can also be expressed in terms of ampere minutes per square inch of copper, 2 ampere minutes per square inch of copper, corresponding to 8 percent of 1 ounce of copper foil, viz., 0.08 ounces of copper per square foot.

As a practical matter, it is desirable to maintain the amount of metal electrodeposited opposite the secondary anode below 10 percent by weight of the total. If more than 10 percent by weight of the final metal is formed opposite the secondary anode and the end product used for printed circuit applications, the tree-like projections formed through the secondary anode treatment tend to penetrate too far into the plastic substrates to which the foil is laminated. This is undesirable for printed circuit applications.

As aforenoted, it is within the contemplation of the present invention not only to provide a novel method for producing copper foil having improved high temperature bond strength and copper foil produced thereby but to provide laminates comprised of said copper foil bonded to an appropriate substrate. As will be apparent, the particular substrate used in this laminate will vary depending upon the use for which the laminate is intended and the service conditions under which such laminate will be used. Particularly appropriate substrates which adapt the laminate for use in forming printed circuits include non-flexible supports such as Teflon-impregnated fiberglas (Teflon is the trademark for polytetrafluoroethylene), Kel-F-impregnated fiberglas ("Kel-F" is a trademark for certain fluorocarbon products including polymers of trifluorochloroethylene and certain copolymers) and the like. Flexible substrates include polyimides such as those known under the designations "Kapton" and "H-Film" (both are manufactured by du Pont and are polyimide resins produced by condensing a pyromellitic anhydride with an aromatic diamine).

The adhesives used to bond the treated copper foil to the substrate are those conventionally used for the specific applications in question, "FEP" (a fluorinated ethylene propylene resin in the form of a copolymer of tetrafluoroethylene and hexafluoropropylene having properties similar to Teflon) being particularly appropriate for the Teflon and Kel-F and conventional epoxy resins being useful for the other materials. The method of bonding the copper foil to the substrate is conventional and forms no part of the present invention, typical details of such bonding being set forth for example in the Waterbury U.S. Pat. No. 3,328,275.

As previously noted, while most desirable results are obtained through utilization of a stainless steel electrodeposition surface on the rotating drum cathode 24, other metal surfaces could be used without losing the advantages of the process of the present invention. Such other surfaces could, by way of example, include lead (such as is disclosed in Zoldas U.S. Pat. No. 2,865,830), crack-free chromium (such as disclosed in Conley et al. U.S. Pat. No. 3,151,048) or the like.

Similarly, while the preferred embodiment of the invention has been described in connection with the initial production of metal foil composed completely of copper, it is equally applicable to the electrodeposition of other metals such as lead, tin, zinc, iron, nickel, gold, silver or the like.

Furthermore, while the process has been described in its preferred embodiment in connection with the formation of both the base metal foil and the tree-like nodular surface deposit in a single electrolytic tank, it is possible to use a preformed metal foil provided the foil is rendered cathodic and passed in proximity to a combined main anode and secondary anode of the type described above. This could be done, by way of example, by wrapping a sheet of metal foil about a rotating cathode of the type shown in FIGS. 1 and 2 and passing such sheet in proximity to the curved anodes 20 and 22. The metal sheet will receive a substantially continuous and relatively smooth primary electrodeposit as it passes adjacent anodes 22 and 20 (which electrodeposit will be formed over the metal of the sheet) and a final, nodular, tree-like deposit of the type indicated as it passes adjacent secondary anode 48. Using such a system, it will be apparent that metals other than the base metal can be electrodeposited atop the latter.

In the preferred embodiment of the present invention, insoluble anodes were used adjacent the rotating drum cathode, such anodes having been noted to create the foam froth containing the microscopic oxygen bubbles which effectively serve as a screen or mask over the initially formed metal foil. It is within the contemplation of the present invention, however, to use anodes other than soluble anodes in lieu of main anode portions 20 and 22, provided one substitutes in lieu thereof a generator of similar bubbles such as a perforated pipe. The limitation on the use of such pipe would be that the bubbles formed must be sufficiently small in size (microscopic) to create the screening effect which is so effectively created by means of insoluble anodes such as have been described above. As was the case with the use of insoluble anodes, such bubbles should constitute about one-quarter to one-half (and preferably about one-third) the volume of the electrolyte between the secondary anode and the cathode surface opposite it.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. In an electrolytic process of producing metal foil in which a drum cathode is rotated adjacent an insoluble anode while at least partially immersed in electrolyte and in which metal foil electrodeposited on said drum is continuously stripped therefrom as said drum rotates, the improvement comprising subjecting a leading portion of said drum cathode underlying a portion of said metal foil which is still immersed in said electrolyte to a current density sufficiently in excess of the current density simultaneously applied to a trailing portion of said drum cathode which is also immersed in said electrolyte so as to form an electrodeposit on the surface of said metal foil in the form of substantially non-powdery, spaced projections having substantially the same mechanical properties as the foil from which they project.

2. A process as defined in claim 1 wherein a foam froth is formed in said electrolyte between said leading portion of said drum cathode and the anode adjacent it.

3. A process as defined in claim 2 wherein said foam froth is formed by the generation of gas bubbles adjacent the surface of the anode opposite said trailing portion of said drum cathode.

4. A process as defined in claim 3 wherein said gas bubbles comprise from about one-fourth to one-half the volume of the electrolyte adjacent said leading portion of said drum cathode.

5. A process as defined in claim 1 wherein said current density to which said leading portion of said drum cathode is subjected is at least about 2,500 $amps/ft^2$.

6. A process as defined in claim 5 wherein said electrolyte contains at least about 90 grams/liter of copper.

7. A process as defined in claim 1 wherein said electrolyte is an aqueous sulfate solution containing at least approximately 60 grams/liter of copper and said current density to which said leading portion of said drum cathode is subjected is at least about 1,500 $amps/ft^2$.

8. A process as defined in claim 1 wherein said metal is copper.

9. A process as defined in claim 1 wherein said metal is copper and wherein a foam froth is formed in said electrolyte between said leading portion of said drum cathode and the anode adjacent it by the generation of gas bubbles adjacent the surface of the anode opposite said trailing portion of said drum cathode, said gas bubbles comprising from about one-fourth to one-half the volume of the electrolyte adjacent said leading portion of said drum cathode, said current density to which said leading portion of said drum cathode is subjected being at least about 1,500 $amps/ft^2$, said electrolyte being an aqueous sulfate solution containing at least approximately 60 grams/liter of copper.

10. A process as defined in claim 9 wherein said electrolyte contains at least about 90 grams/liter of copper and said current density to which said leading portion of said drum cathode is subjected is at least about 2,500 $amps/ft^2$.

11. A process as defined in claim 1 wherein said electrodeposit constitutes less than about 10 percent by weight of the total weight of the metal foil resulting from said electrolytic process.

12. An electrolytic process for producing metal foil having enhanced bond strength comprising electrolytically forming metal foil in a body of electrolyte by subjecting the cathode on which said foil is to be formed to a first current density, and forming a metal electrodeposit on the surface of said foil from said same body of electrolyte by simultaneously subjecting said cathode on which said foil has been formed to a second current density sufficiently in excess of said first current density while masking said foil surface so that the latter comes in substantial contact with said electrolyte of substantially the same composition as said body of electrolyte only at a plurality of spaced locations, so as to form a metal electrodeposit in the form of substantially non-powdery, spaced projections having substantially the same mechanical properties as said foil.

13. In an electrolytic process of producing metal foil in which a drum cathode is rotated adjacent an insoluble anode while at least partially immersed in electrolyte and in which metal foil electrodeposited on said drum is continuously stripped therefrom as said drum rotates, the improvement comprising subjecting a leading portion of said drum cathode underlying a portion of said metal foil which is still immersed in said electrolyte to a current density sufficiently in excess of the current density simultaneously applied to a trailing portion of said drum cathode which is also immersed in said electrolyte so that metal electrodeposited on said first surface portion forms at a plurality of spaced locations rather than substantially uniformly across said first surface portion.

14. A sheet of metal foil produced by the process of claim 13.

15. A laminate comprising the foil defined in claim 14 and a supporting substrate, one surface of said foil being bonded to said substrate.

16. Electrolytic apparatus for producing metal foil having enhanced bond strength comprising electrolyte-containing means; anode means; means for rendering said metal foil cathodic; means for subjecting a first surface portion of said metal foil while said foil is immersed in electrolyte in said electrolyte-containing means to a current density sufficiently in excess of the current density simultaneously applied to a second surface portion of said metal foil upstream of said first surface portion while said foil is immersed in said electrolyte so that metal electrodeposited on said first surface portion forms at a plurality of spaced locations rather than substantially uniformly across said first surface.

17. Apparatus as defined in claim 16 additionally comprising means for forming a foam froth in said electrolyte between said anode and said first surface portion.

18. Apparatus as defined in claim 17 wherein said means for rendering said metal foil cathodic is a drum cathode on which said metal foil is electrodeposited; said anode substantially conforming to but being spaced from the surface of said drum; said anode being insoluble in the electrolyte used in said electrolytic apparatus; said insoluble anode comprising said foam froth forming means.

* * * * *